(12) United States Patent
Bernard et al.

(10) Patent No.: US 7,691,440 B2
(45) Date of Patent: Apr. 6, 2010

(54) METHOD AND INSTALLATION FOR THE DENSIFICATION OF SUBSTRATES BY MEANS OF CHEMICAL VAPOR INFILTRATION

(75) Inventors: Bruno Bernard, Pessac (FR); Stéphane Goujard, Merignac (FR); Sébastien Bertrand, Moulis en Medoc (FR)

(73) Assignee: SNECMA Propulsion Solide, Le Haillan (FR)

( * ) Notice: Subject to any disclaimer, the term of this patent is extended or adjusted under 35 U.S.C. 154(b) by 1160 days.

(21) Appl. No.: 10/475,464

(22) PCT Filed: Jan. 14, 2003

(86) PCT No.: PCT/FR03/00097

§ 371 (c)(1),
(2), (4) Date: Jul. 23, 2004

(87) PCT Pub. No.: WO03/060183

PCT Pub. Date: Jul. 24, 2003

(65) Prior Publication Data

US 2004/0237898 A1 Dec. 2, 2004

(30) Foreign Application Priority Data

Jan. 15, 2002 (FR) .................................. 02 00412

(51) Int. Cl.
*C23C 16/00* (2006.01)

(52) U.S. Cl. .................... 427/248.1; 427/230; 427/237; 427/249; 427/255; 427/900; 118/719; 118/720

(58) Field of Classification Search ................. 427/248, 427/248.1; 118/719
See application file for complete search history.

(56) References Cited

U.S. PATENT DOCUMENTS

| 2,729,190 A | | 1/1956 | Pawlyk |
| 4,580,524 A | * | 4/1986 | Lackey et al. ............... 118/725 |
| 5,904,957 A | * | 5/1999 | Christin et al. ........... 427/248.1 |
| 6,402,849 B2 | * | 6/2002 | Kwag et al. ................. 118/715 |
| 6,942,893 B2 | * | 9/2005 | Delperier et al. ............ 427/237 |
| 6,953,605 B2 | * | 10/2005 | Sion et al. ................ 427/248.1 |

FOREIGN PATENT DOCUMENTS

| EP | 0 792 385 B1 | 9/1997 |
| FR | 2 754 813 | 4/1998 |
| WO | WO 98/17599 | 4/1998 |
| WO | WO 99/04059 | 1/1999 |

\* cited by examiner

*Primary Examiner*—Nadine Norton
*Assistant Examiner*—Maki Angadi
(74) *Attorney, Agent, or Firm*—Weingarten, Schurgin, Gagnebin & Lebovici LLP

(57) ABSTRACT

A method of densifying porous substrates by chemical vapor infiltration comprises loading porous substrates for densification in a loading zone of an enclosure (10), heating the internal volume of the enclosure, and introducing a reagent gas into the enclosure though an inlet situated at one end of the enclosure. Before coming into contact with substrates (20) situated in the loading zone, the reagent gas admitted into the enclosure is preheated, at least in part, by passing along a duct (30) connected to the gas inlet and extending through the loading zone, the duct being raised to the temperature inside the enclosure, and the preheated reagent gas is distributed in the loading zone through one or more openings (33) formed in the side wall (32) of the duct, along the duct.

21 Claims, 7 Drawing Sheets

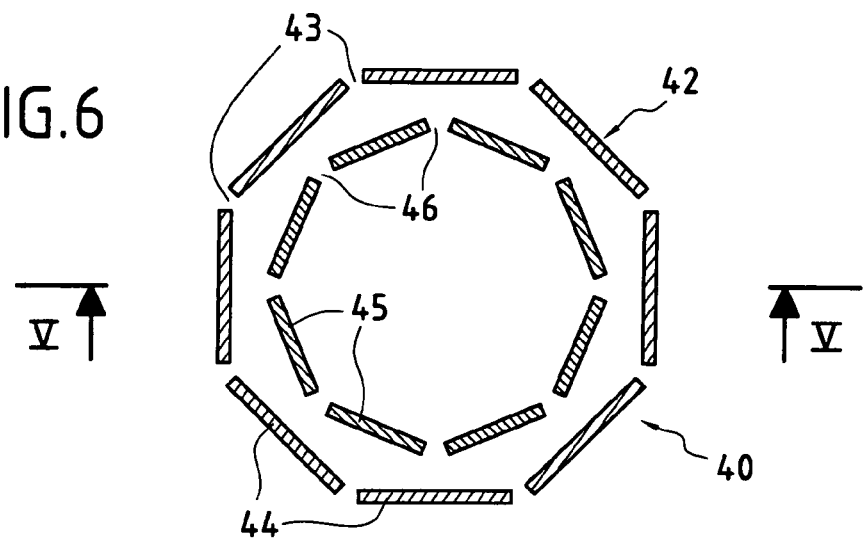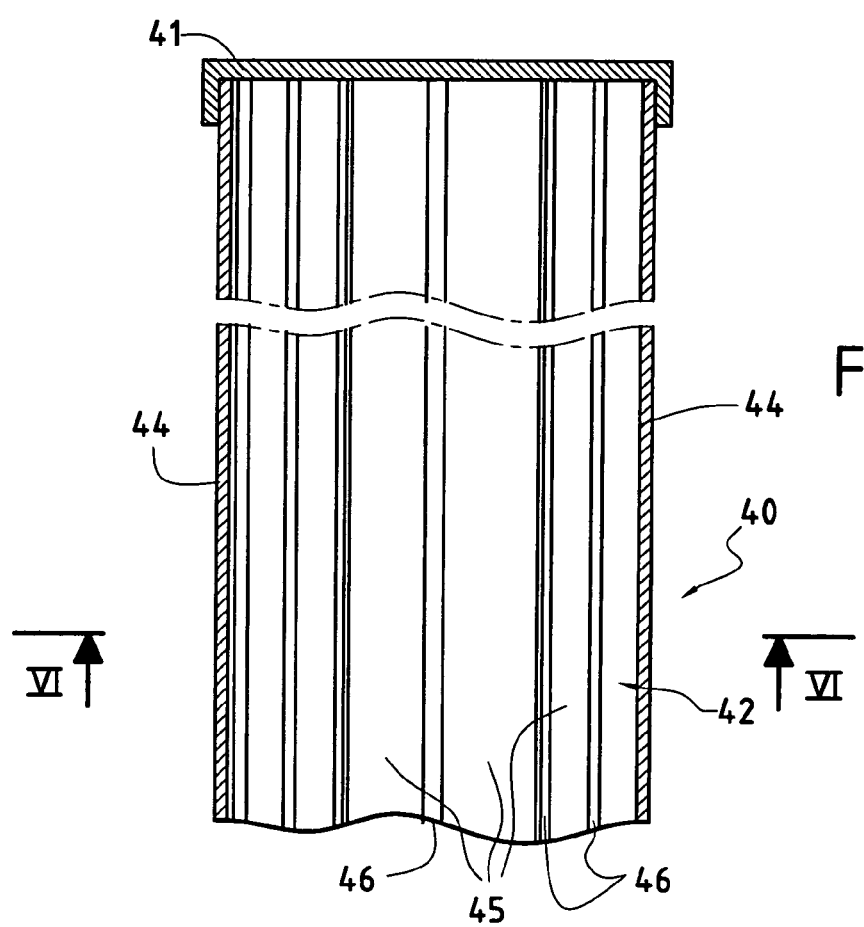

METHOD AND INSTALLATION FOR THE DENSIFICATION OF SUBSTRATES BY MEANS OF CHEMICAL VAPOR INFILTRATION

This application is the entry of the U.S. national phase filing under 35 C.F.R. 371 of International Application No. PCT/FR03/00097 filed Jan. 14, 2003, and claims priority to French application 02 00412 filed Jan. 15, 2002.

BACKGROUND OF THE INVENTION

The invention relates to chemical vapor infiltration techniques. The field of application of the invention is densifying porous substrates, in particular making composite material parts by densifying fiber substrates by means of a matrix.

In conventional manner, a method of densifying substrates by chemical vapor infiltration comprises the steps of loading porous substrates to be densified into a loading zone of an enclosure, heating the internal volume of the enclosure, introducing a reagent gas in the enclosure through an inlet situated at one end thereof, and preheating the reagent gas after it has entered into the enclosure and before it comes into contact with the parts situated in the loading zone.

The temperature and the pressure that exist inside the enclosure are selected so as to enable the reagent gas to diffuse into the pores of the substrates and deposit therein the material for constituting the matrix, either by one or more components of the reagent gas decomposing, or else by a plurality of components reacting together.

The reagent gas is conventionally preheated by passing the gas through a preheater zone situated inside the enclosure and into which the reagent gas inlet opens out. A conventional preheater zone comprises a plurality of perforated plates disposed one above the other and raised to the temperature inside the enclosure.

The purpose of preheating the reagent gas is to ensure that when it enters into the loading zone it is at a temperature that is as close as possible to the temperature required for forming the desired matrix. When the reaction temperature is typically about 1000° C. in order to form a matrix of pyrolytic carbon or of ceramic, having the reagent gas at a temperature that is only a few tens of ° C. below the desired temperature can have a significant effect on the rate of densification and on the microstructure of the deposited matrix material.

This has been observed particularly in the case of densifying substrates disposed in stacks, in particular substrates of annular shape for making brake disks out of composite material. Methods and installations for densifying annular substrates in stacks are described in documents U.S. Pat. No. 5,904,957 and EP 0 792 385. The reagent gas coming from the preheater zone is admitted into the internal volumes of the stacks which are made up of superposed annular substrates and which extend vertically in the loading zone above the preheater zone, with the reagent gas inlet being situated at the bottom of the enclosure. A densification gradient is observed between the substrates situated at the bottoms of the stacks and the other substrates, which gradient becomes greater the more insufficient the preheating of the reagent gas.

The problem could be solved by increasing the volume of the preheater zone. However, for a given total enclosure volume, that would reduce the space available into which substrates can be loaded. Unfortunately, the processes of densification by chemical vapor infiltration are lengthy and expensive to implement, so installations need to have their loading capacities used to the full.

In addition, the reagent gas reaching the tops of the stacks has traveled through them along their full height and has matured, such that the substrates situated at the top of the stacks receive a reagent gas of composition that may be different from that of the reagent gas on entering into the loading zone. This also can give rise to densification characteristics that are different.

OBJECT AND SUMMARY OF THE INVENTION

An object of the invention is to provide a method enabling the distribution and the preheating of the reagent gas to be improved, and more generally enabling densification gradients between substrates situated at different locations in the loading zone to be reduced, and to achieve this without decreasing loading capacity, and possibly even while increasing it.

This object is achieved by a method as defined in the introduction to the description and in which the reagent gas admitted into the enclosure is preheated, at least in part, by passing along a duct connected to the gas inlet and extending through the loading zone, the duct being raised to the temperature inside the enclosure, and the preheated reagent gas is distributed into the loading zone through one or more openings formed in the side wall of the duct, along the length thereof.

Thus, the duct serves both to preheat the reagent gas and to distribute it in the loading zone.

The reagent gas may be distributed via one or more slots extending longitudinally through the side wall of the duct.

In a variant, the reagent gas may be distributed in the enclosure via a plurality of perforations formed through the side wall of the duct.

In order to enhance preheating, the reagent gas advantageously flows inside the duct while making contact with walls forming heat exchanger surfaces that extend into the inside of the duct.

When densifying annular substrates placed in the loading zone in at least one vertical stack, the reagent gas admitted into the enclosure is advantageously preheated and distributed by passing along a duct extending vertically inside the stack.

The reagent gas is then preferably distributed solely via openings formed in the side wall of the duct.

Another object of the invention is to provide an installation enabling the above-defined method to be implemented.

This object is achieved by an installation comprising an enclosure inside which there is a zone for loading substrates to be densified, a susceptor defining the enclosure and associated with means for heating the enclosure, a reagent gas inlet at one end of the enclosure, and means situated inside the enclosure for preheating the reagent gas, in which installation a duct is connected to the reagent gas inlet inside the enclosure and extends through the loading zone, the duct being provided along its length with lateral openings which open out into the loading zone in order to distribute the reagent gas therein.

In an embodiment, the openings are in the form of at least one longitudinal slot. The wall of the tube may then be formed by a plurality of panels leaving longitudinal gaps between one another.

In another embodiment, the openings are in the form of perforations distributed along the duct.

Advantageously, walls are disposed inside the duct. These internal walls can then be in the form of longitudinal panels that leave gaps between one another.

BRIEF DESCRIPTION OF THE DRAWINGS

The invention will be better understood on reading the following description given by way of non-limiting indication and made with reference to the accompanying drawings, in which:

FIG. 5 is an elevation view showing another embodiment of a duct for preheating and distributing the reagent gas;

FIG. 6 is a cross-section view of the FIG. 5 duct;

DETAILED DESCRIPTION OF EMBODIMENTS

Figure 1:
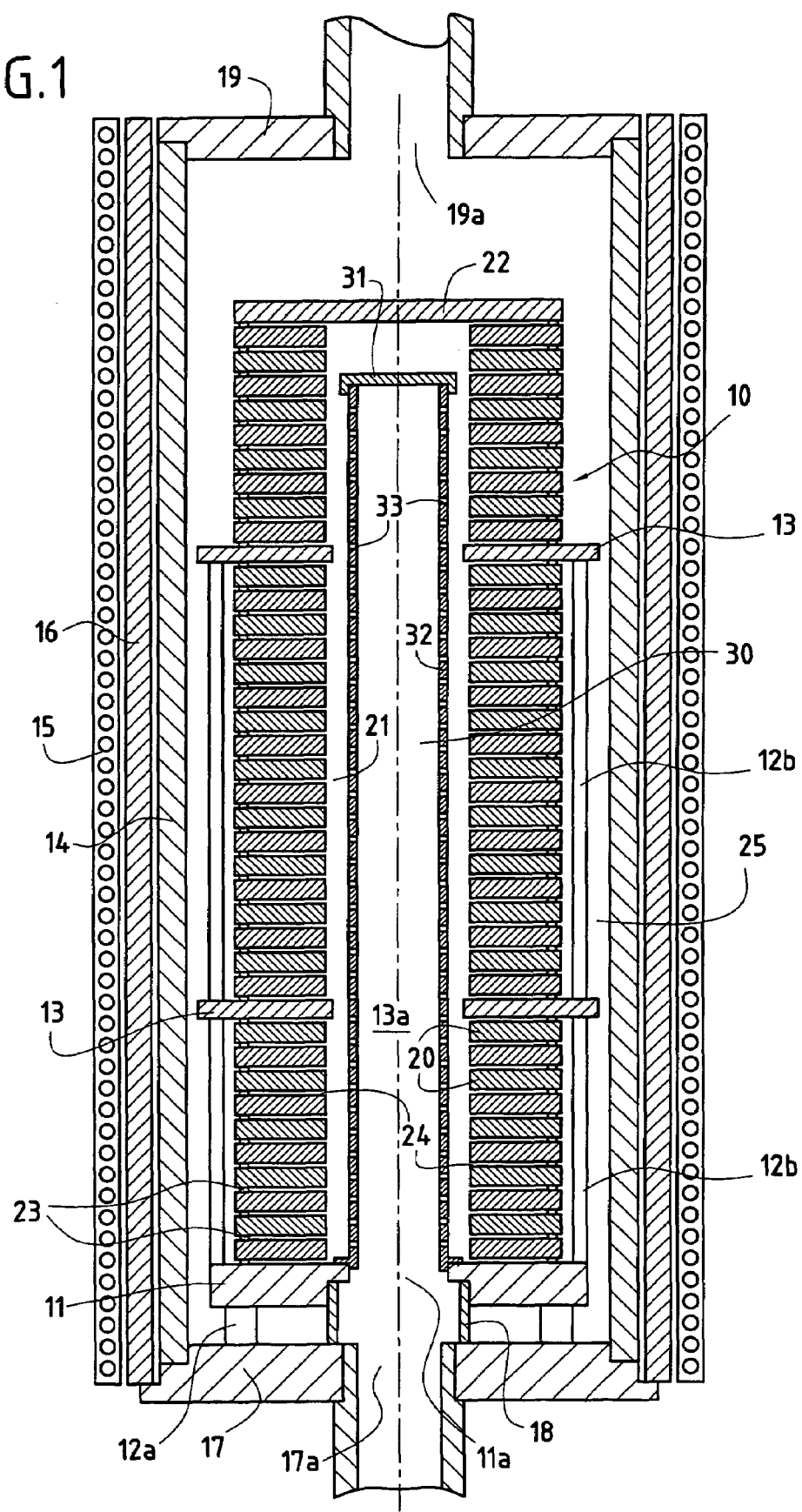
FIG. 1 is a diagrammatic elevation view in section showing an installation for densification by chemical vapor infiltration in an embodiment of the invention.

FIG. 1 is a diagram of an enclosure 10 containing a load of porous substrates 20. By way of example, the substrates 20 are carbon fiber preforms or blanks constituted by pre-densified preforms, which preforms or blanks are for use in making brake disks of carbon/carbon (C/C) composite material by being densified with a matrix of pyrolytic carbon.

The load is in the form of a stack of substrates defining an inside volume 21 formed by the central passages in the vertically-aligned substrates. The stack is carried by a bottom support plate 11 standing on legs 12a. It may be made up of a plurality of superposed sections that are separated from one another by one or more intermediate support plates 13. The plate 11 is provided with an opening 11a which is in axial alignment with the central passages through the substrates 20 and with openings 13a in the intermediate plates 13. At its top, the stack of substrates is provided with a cover 22 closing the internal volume 21. The plates 13 are supported by the support plate 11 via columns or posts 12b.

Figure 2:
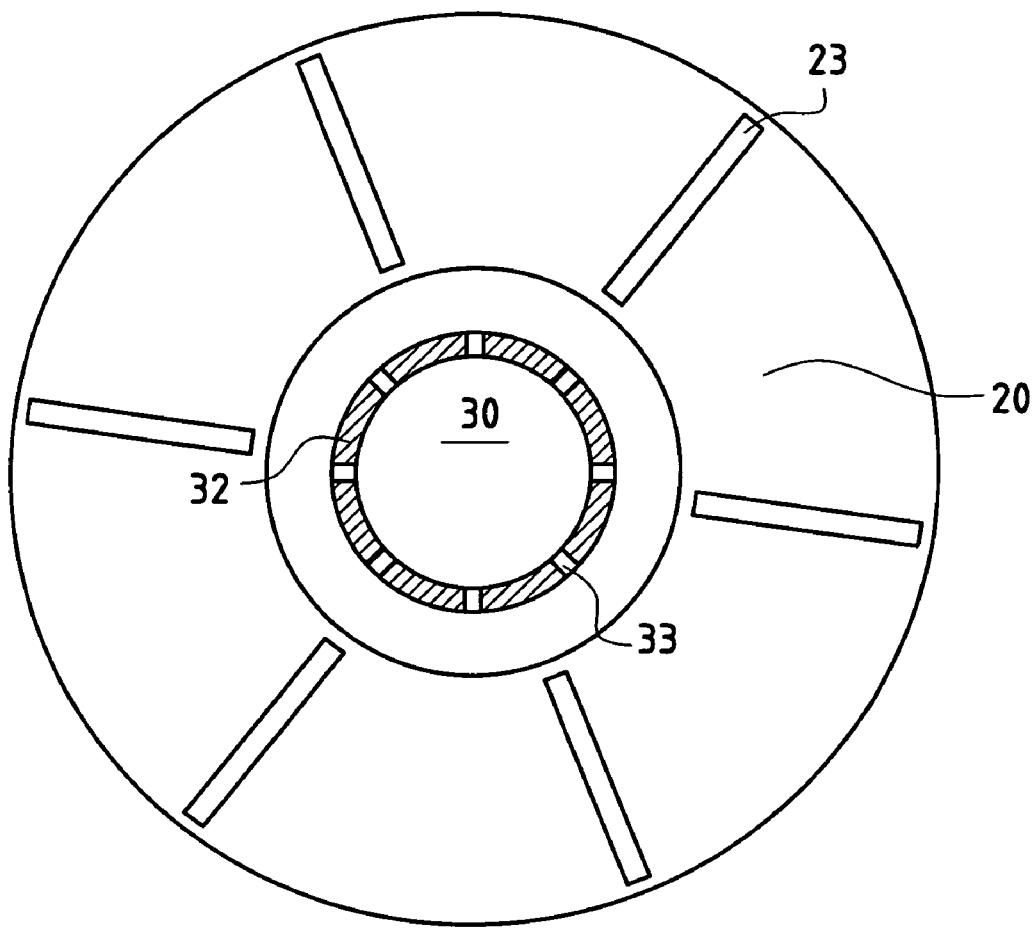
FIG. 2 is a fragmentary cross-section view on a larger scale showing more particularly the duct for preheating and distributing the reagent gas in the FIG. 1 installation.

Each substrate 20 is separated from an adjacent substrate, and where appropriate from an adjacent plate 11 or 13 or the cover 22 by one or more spacers 23 which define gaps 24 (see FIGS. 1 and 2). The spacers 23, which are disposed radially for example, are arranged to form passages that put the internal volume 21 into communication with an external volume 25 situated inside the enclosure and outside the stack.

The passages left between the spacers 23 may be dimensioned in such a manner as to balance pressures between the volumes 21 and 25, as described in document U.S. Pat. No. 5,904,957. In a variant, they may constitute leakage passages providing a flow section that is small so as to allow a pressure gradient to exist between the volumes 21 and 25, as described in French patent application No. 01/03004.

The enclosure is heated by means of a susceptor 14 which defines the sides of the enclosure. By way of example, the heater plate is constituted by an inductor inductively coupled with an induction coil 15. The coil 15 surrounds the enclosure and is separated from the susceptor 14 by a wall 16 that provides thermal insulation. In a variant, the susceptor may be heated by means of electrical resistances thermally coupled therewith.

A reagent gas containing one or more constituents that are precursors of carbon is introduced into the enclosure through an opening 17a formed in the bottom 17 of the enclosure. The precursors are gaseous hydrocarbons, typically methane, propane, or a mixture thereof. In the gap between the bottom 17 and the plate 12, the reagent gas is channeled by a cylindrical wall 18 interconnecting the openings 17a and 11a.

A vertical tubular duct 30 has its bottom end connected to the opening 11a and extends vertically inside the volume 21 to the immediate vicinity of the top of the stack of substrates. At its top end, the duct 30 is closed by a cover 31. The duct 30 may be made up of a plurality of sections connected end to end so as to enable it to be built up in modular manner.

In the example shown in FIGS. 1 and 2, the duct 30 has its side wall 32 provided with a plurality of openings 33 in the form of perforations which are distributed both along the length of the duct 30 and around the axis thereof.

Thus, the reagent gas admitted into the enclosure is distributed into the internal volume 21 by passing through the openings 33 in the duct 30 and passes from the volume 21 to the volume 25 by diffusing through the substrates 20 and passing through the passages left between the spacers 23. The residual gas is extracted from the enclosure 10 via an opening 19a formed through the cover 19 of the enclosure and connected to suction means (not shown).

The duct 30 serves not only to distribute the reagent gas over the full height of the stack, but also to preheat this gas, the duct 30 being raised to the temperature that exists inside the enclosure.

Figure 3:
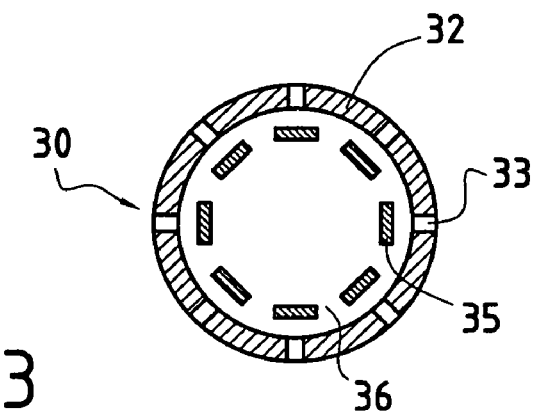
FIG. 3 is a cross-section view showing a variant embodiment of the duct for preheating and distributing the reagent gas.

In order to improve preheating, internal heat exchanger walls may be disposed inside the duct 30. In the embodiment of FIG. 3, these inside walls are in the form of longitudinal panels 35 distributed around the axis of the duct and leaving gaps 36 between one another.

The duct 30, the cover 31, and any internal walls 35 are made of graphite, for example. Other materials could be used, for example a C/C composite material. The walls 14, 17, 19 of the enclosure 10 are advantageously made of graphite. The plates 11, 13, the cover 22, the spacers 23, and the wall 18 are made, for example, out of graphite or out of C/C composite material.

Figure 4:
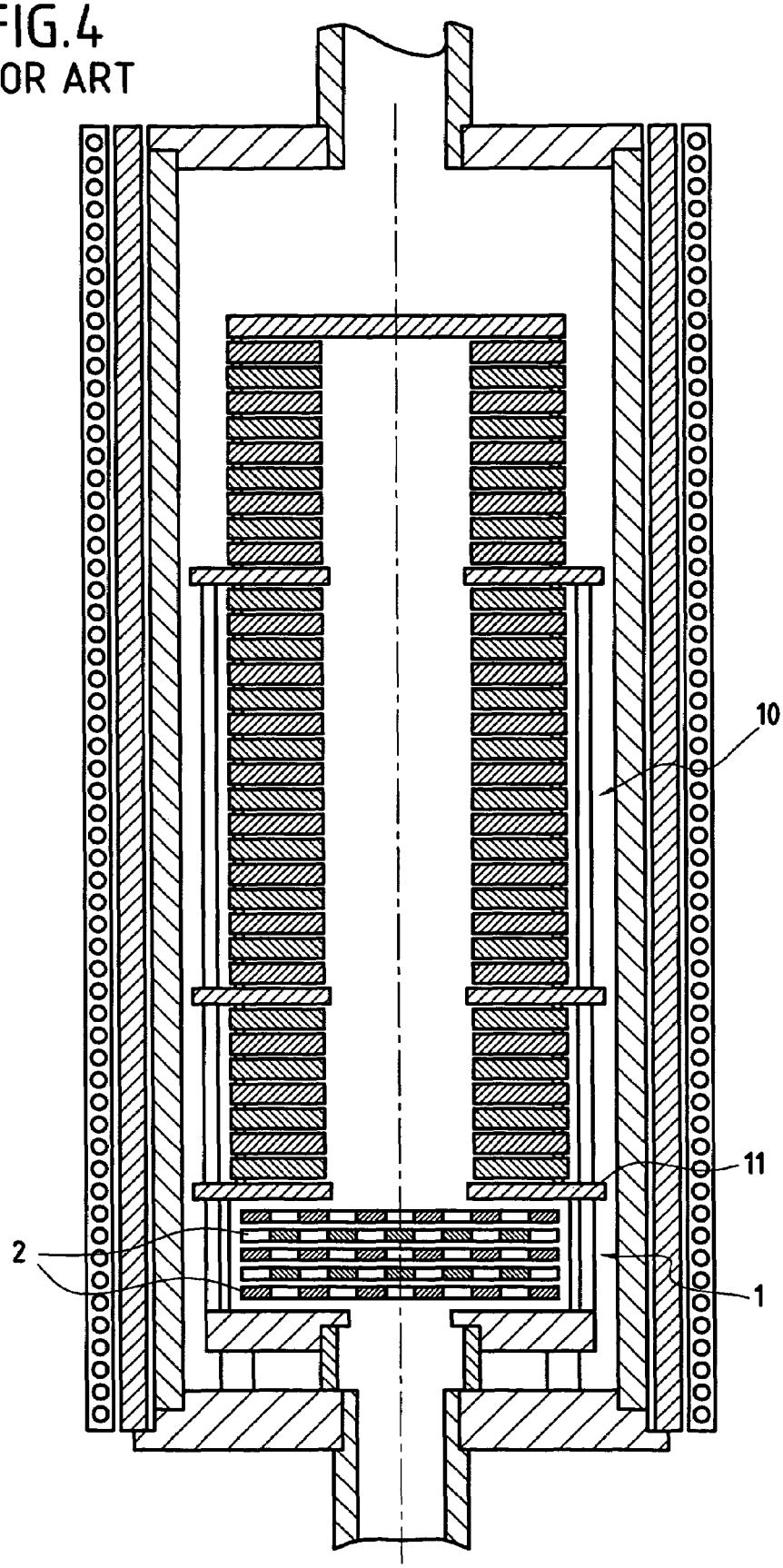
FIG. 4 is a diagrammatic elevation view in section showing an embodiment of a prior art installation for densification by chemical vapor infiltration.

In comparison with a prior art installation having a preheater zone 1 between the reagent gas inlet and the plate 11 on which the stack stands (see FIG. 4), the installation of FIGS. 1 and 2 does not have a preheater zone, thereby providing significantly increased loading capacity. The loading zone of the enclosure 10 which extends above the plate 11 is greater than the loading zone in the installation of FIG. 4, with the preheater zone and the perforated plates 2 situated one above another occupying a relatively large amount of space in that installation.

Nevertheless, it should be observed that it is possible for a preheater zone to be present in the context of the invention, which zone can be smaller than those of prior art installations.

The diameter of the duct 30 must be large enough to be capable of providing a large area for heat exchange, while nevertheless being spaced apart from the stack of substrates 20.

FIGS. 5 and 6 show a variant embodiment of a duct 40 for preheating and distributing reagent gas that can take the place of the duct 30 in the installation of FIGS. 1 and 2.

The side wall 42 of the duct 40 has openings 43 in the form of longitudinal slots that extend over the entire length of the duct, the duct being closed by a cover 41 at its top end. In the example shown, the slots 43 are rectilinear and they are regularly distributed around the axis of the duct 40.

The slots 43 are formed by gaps between longitudinal panels 44 that make up the side wall 42 of the duct 40. Additional internal walls for heat exchange purposes are disposed inside the duct 40. As in the embodiment of FIG. 3, these internal walls are in the form of longitudinal panels 45 distributed around the axis of the duct and leaving gaps 46 between one another. The panels 44 and 45 are disposed in a staggered configuration around the axis of the duct 40 so that each gap 46 opens out facing a panel 44 between two slots 43.

Naturally, the slots could follow paths other than rectilinear paths, for example they could follow helical paths from the bottom to the top of the duct.

In general, it is possible to give any desired shape to the openings formed in the side wall of the duct, for example oblong shapes or elongate openings extending axially, circumferentially, or obliquely.

In the embodiment of FIGS. 1 and 2, a single stack of substrates 20 is shown. In a variant, a plurality of stacks of substrates could be placed side by side inside the enclosure. In which case, a respective duct for preheating and distributing reagent gas is placed inside each stack and is connected to a common inlet for the reagent gas, or preferably to a particular inlet in alignment with the duct.

It should also be observed that the flow direction of the reagent gas may be reversed, with a gas inlet being formed through the cover of the enclosure and an outlet formed in the bottom which is spaced apart from the plate supporting the stack, with the central passage of the stack then being closed at its bottom end.

Figure 7:
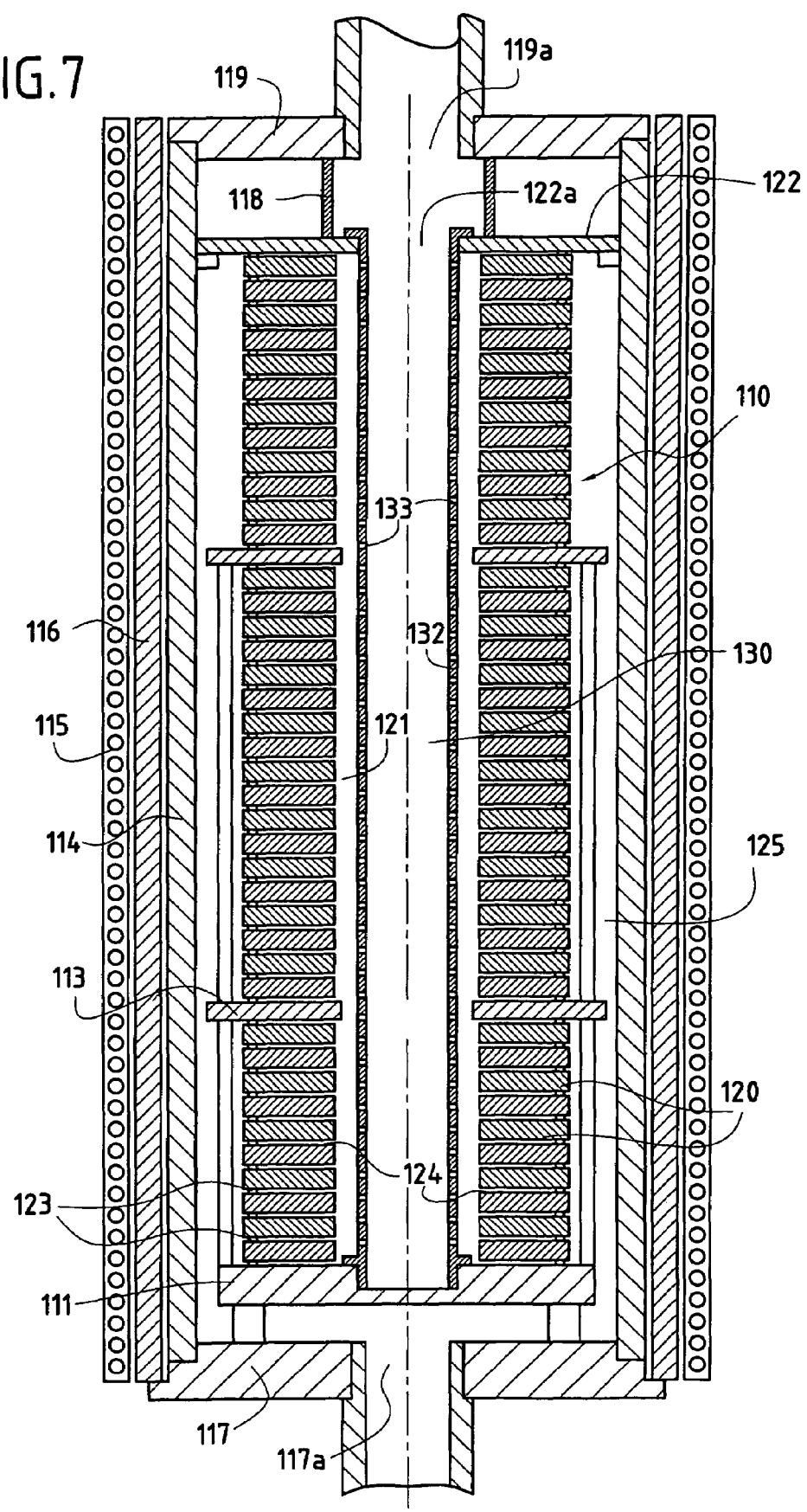
FIG. 7 is a diagrammatic elevation view in section showing an installation for densification by chemical vapor infiltration constituting another embodiment of the invention.

As shown in FIG. 7, and in the same manner as shown in FIG. 1, the stack of annular substrates 120 is received in an enclosure 110 defined laterally by a susceptor 114 inductively coupled with an induction coil 115, there being insulation 116 disposed between them. The stack of substrates 120 is formed by a plurality of sections that are superposed and separated from one another by one or more intermediate plates 113, and standing on the bottom plate 111 which does not have a central opening so as to close the stack.

At its top end, the stack is surmounted by a cover 122 provided with a central opening 122a in axial alignment with the internal volume 121 of the stack.

Between its inlet into the enclosure 110 through the cover 119 and the central opening 122a, the admitted reagent gas is channeled by a cylindrical wall 118 which may optionally surround a small gas preheater zone.

A vertical tubular duct 130 has its top end connected to the opening 122a and extends down to the plate 111 which closes the bottom end of the duct. The duct 130 may be similar to the duct 30 or the duct 40 described above. In the example shown, the duct 130 has a wall 132 provided with a plurality of openings 133 that are distributed along the length and around the axis of the duct.

The reagent gas admitted into the enclosure is distributed in the internal volume 121 of the stack of substrates by passing through the openings 133. The gas passes from the volume 121 to the volume 125 outside the stack of substrates by diffusing through the substrates 120 and by passing through the passages left between spacers interposed between the substrates. The residual gas is extracted from the enclosure through the central opening 117a in the bottom 117 of the enclosure.

Otherwise, the installation is similar to that of FIG. 1.

Figure 8:
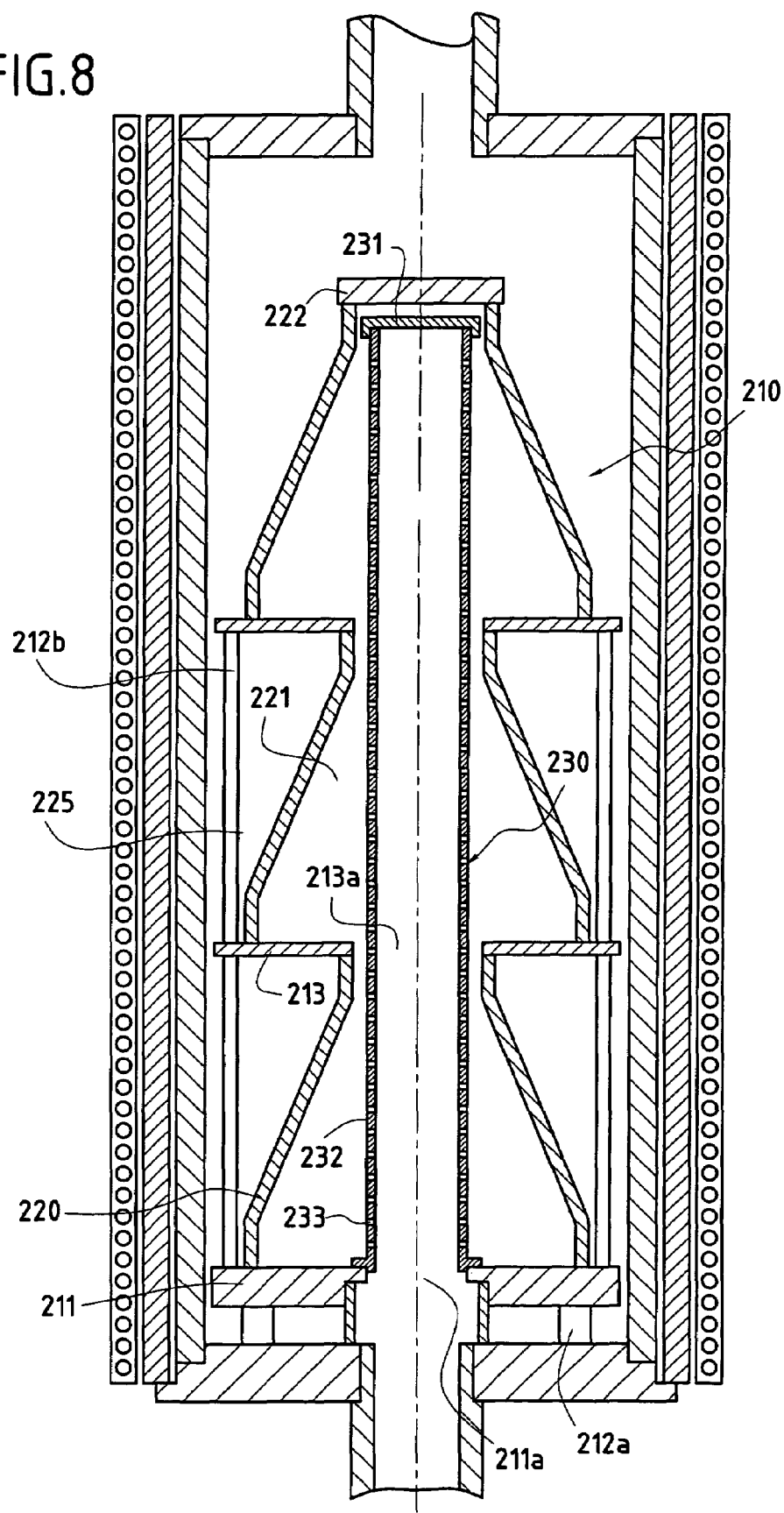
FIGS. 8 and 9 are diagrammatic elevation views in section showing her applications of an installation of the invention.

The method and the installation of the invention can be used for densifying porous substrates other than brake disk preforms, for example for substrates constituting preforms 220 for the diverging portions of rocket engines, as shown in FIG. 8.

A plurality of substrates 220 are disposed in the same loading zone of an enclosure 210 with their axial passages in vertical alignment. The bottom substrate is carried by a plate 211 which stands on legs 212a, while the other substrates stand on annular intermediate plates 213. The plates 213 are supported by the support plate 211 via columns or posts 212b.

With the central openings 213a in the plates 213 the internal volumes of the substrates 220 form the internal volume 221 of the stack of substrates. The volume 221 is closed by a cover 222 at its top end. Spacers 223 are interposed between the axial ends of the substrates 220 and the plates 211, 213, thereby enabling passages to be left to put the volume 221 into communication with the volume 225 outside the substrates and inside the enclosure.

A duct 230 for preheating and distributing the reagent gas is connected at a bottom end to a central opening 211a of the plate 211. The duct 230 extends vertically inside the volume 221 to the immediate vicinity of the top of the stack of substrates, where the duct 230 is closed by a cover 231.

The side wall 232 of the duct 230 has openings 233, e.g. in the form of perforations, the duct 230 being of the same type as the duct 30 in the embodiment of FIGS. 1 and 2.

Otherwise, the installation is identical to the embodiment of FIGS. 1 and 2.

The field of application of the invention is not limited to densifying substrates of annular shape or of hollow axially symmetrical shape.

Figure 9:
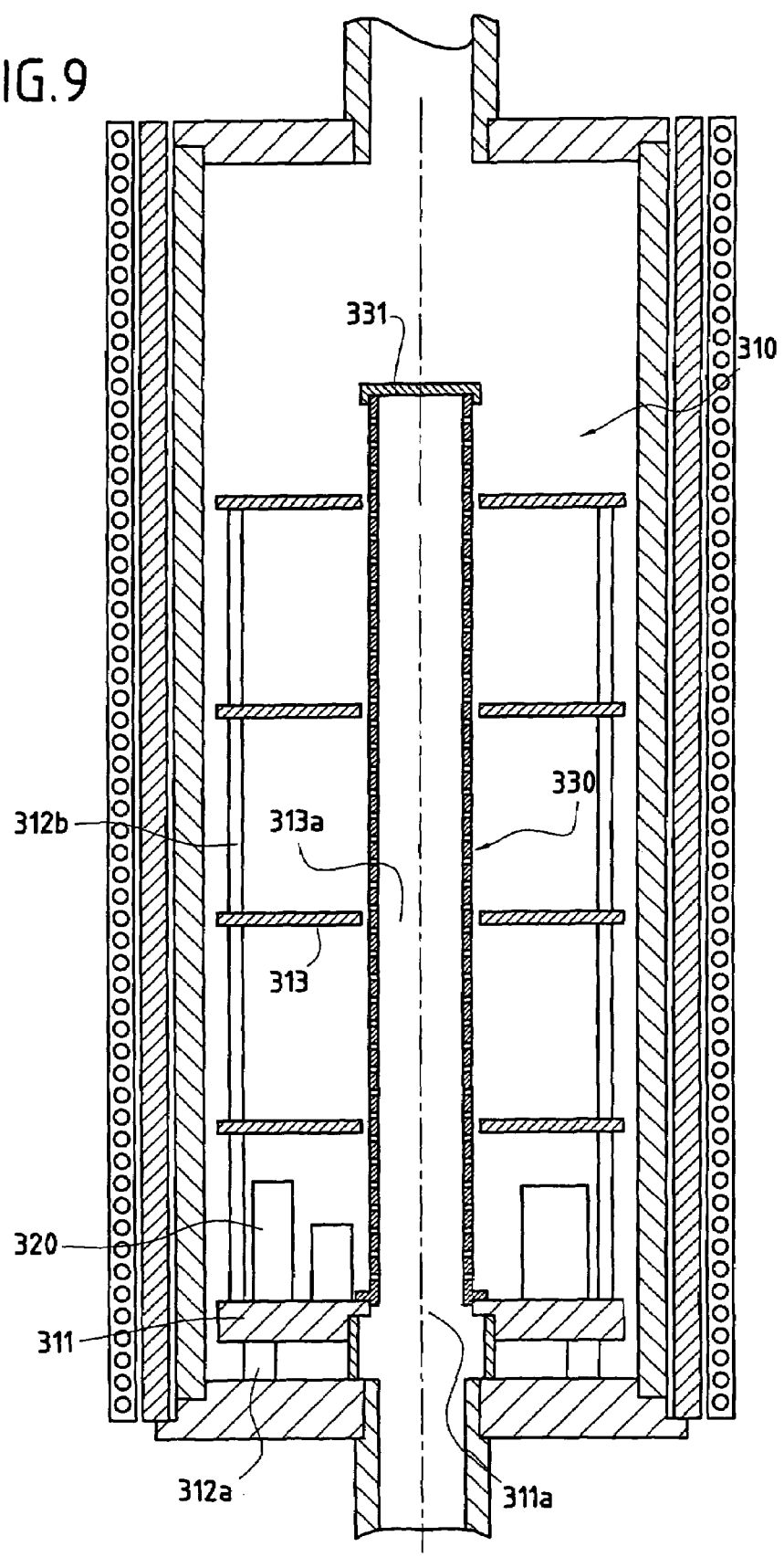

Thus, FIG. 9 shows an enclosure 310 having a bottom support plate 311 and a plurality of intermediate support plates 313 in a loading zone of the enclosure 310. The plates 311 and 313 are provided with respective central openings 311a and 313a that are in alignment with an inlet for admitting reagent gas into the enclosure.

A vertical duct 330 for preheating and distributing the reagent gas has its bottom end connected to the opening 311a and extends vertically through the loading zone of the enclosure 310, passing through the openings 313a. At its top end situated in the vicinity of the top of the loading zone, the duct 330 is closed by a cover 331.

The plates 311 and 313 are supported by legs 312a and by columns 312b.

The plates 311, 313 support substrates for densifying 320 (not all of them are shown) which may be in a variety of shapes and sizes.

Otherwise, the installation is identical to that shown in FIGS. 1 and 2.

It should be observed that the method and the installation of the invention can be implemented for densifying porous substrates with matrices other than matrices of pyrolytic carbon, for example with ceramic matrices. Chemical vapor infiltration processes for ceramic matrices, e.g. made of silicon carbide (SiC), are well known. The composition of the reagent gas is selected as a function of the nature of the matrix that is to be deposited.

It should also be observed that the flow section offered by the openings passing through the side walls of the duct for preheating and distributing the gas may be distributed uniformly or otherwise along the height of the duct. A non-uniform distribution may be adopted specifically when the need for reagent gas is greater at certain levels of the tube than at other levels. This can be the case when the configuration of the load of substrates and/or the dimensions of the substrates vary along the height of the loading zone.

The invention claimed is:

1. A method of densifying porous substrates by chemical vapor infiltration, the method comprising loading porous substrates for densification in a loading zone of an enclosure, the porous substrates being arranged along an entire longitudinal dimension therein, the substrates occupying different levels between a bottom support plate located at a first end of the loading zone and a second opposite end of the loading zone;
   introducing a reagent gas into the enclosure via an inlet situated at one end thereof;
   admitting the reagent gas into the loading zone through at least one opening formed at one of said longitudinal ends of the loading zone; and
   heating the reagent gas after it has entered into the loading zone and before it comes into contact with the substrates situated in the loading zone by causing the reagent gas to pass within a side wall of a duct opening at a first longitudinal end thereof through an inlet tightly and directly connected to said at least one opening, said duct extending continuously through the loading zone substantially over the entire longitudinal dimension thereof along which said substrates are located and being spaced apart from said substrates, and said duct being closed at a second longitudinal end thereof opposite to said first longitudinal end;
   the duct being raised to the temperature inside the enclosure; and
   distributing the heated reagent gas among said substrates arranged at different levels in the loading zone through a plurality of openings formed in the side wall of the duct, along the length thereof, the heated reagent gas being distributed along the loading zone by exiting from the duct only through the side openings thereof.

2. A method according to claim 1, characterized in that the reagent gas is distributed through one or more slots extending longitudinally through the side wall of the duct.

3. A method according to claim 2 for densifying annular substrates disposed in the loading zone as at least one vertical stack, the method being characterized in that the reagent gas admitted into the loading zone is preheated and distributed inside the loading zone by passing along the duct extending vertically inside the stack.

4. A method according to claim 2, characterized in that the reagent gas flows along the duct in contact with walls forming heat exchange surfaces and extending inside the duct.

5. A method according to claim 1, characterized in that the reagent gas is distributed through a plurality of perforations formed through the side wall of the duct.

6. A method according to claim 5 for densifying annular substrates disposed in the loading zone as at least one vertical stack, the method being characterized in that the reagent gas admitted into the loading zone is preheated and distributed inside the loading zone by passing along the duct extending vertically inside the stack.

7. A method according to claim 6, characterized in that the reagent gas flows along the duct in contact with walls forming heat exchange surfaces and extending inside the duct.

8. A method according to claim 7 for densifying annular substrates disposed in the loading zone as at least one vertical stack, the method being characterized in that the reagent gas admitted into the loading zone is preheated and distributed inside the loading zone by passing along the duct extending vertically inside the stack.

9. A method according to claim 1, characterized in that the reagent gas flows along the duct in contact with walls forming heat exchange surfaces and extending inside the duct.

10. A method according to claim 9 for densifying annular substrates disposed in the loading zone as at least one vertical stack, the method being characterized in that the reagent gas admitted into the loading zone is preheated and distributed inside the loading zone by passing along the duct extending vertically inside the stack.

11. A method according to claim 1 for densifying annular substrates disposed in the loading zone as at least one vertical stack, the method being characterized in that the reagent gas admitted into the loading zone is preheated and distributed inside the loading zone by passing along the duct extending vertically inside the stack.

12. A method according to claim 11, characterized in that the reagent gas is distributed solely via openings formed in the side wall of the duct.

13. An installation for densifying porous substrates by chemical vapor infiltration, the installation comprising an enclosure having a loading zone contained in the enclosure for loading substrates to be densified along an entire longitudinal dimension, the loading zone extending between a bottom support plate located at a first end of the loading zone and a second opposite end, a susceptor defining the enclosure and associated with means for heating the enclosure, and a reagent gas inlet at one end of the enclosure in fluid communication with at least one opening formed at one of said ends of the loading zone; and
   means situated inside the enclosure for heating the reagent gas,
   the installation further comprising a duct, having an inlet at a first longitudinal end thereof, which is tightly and directly connected to said at least one opening formed in the bottom support plate, the duct extending continuously through the loading zone substantially over the entire longitudinal dimension thereof and being closed at a second longitudinal end opposite to said first longitudinal end, the duct being provided along its length with lateral openings which open out into the loading zone to allow the reagent gas heated by passing along the duct to be distributed through said lateral openings towards substrates loaded at different levels of the loading zone between the first end and the second end thereof.

14. An installation according to claim 13, characterized in that the openings are in the form of at least one longitudinal slot.

15. An installation according to claim 14, characterized in that the wall of the tube is formed by a plurality of panels leaving longitudinal gaps between one another.

16. An installation according to claim 15, characterized in that the walls are disposed inside the duct.

17. An installation according to claim 16, characterized in that said internal walls are in the form of longitudinal panels leaving spaces between one another.

18. An installation according to claim 14, characterized in that the walls are disposed inside the duct.

19. An installation according to claim 18, characterized in that said internal walls are in the form of longitudinal panels leaving spaces between one another.

20. An installation according to claim 13, characterized in that the openings are in the form of perforations distributed along the duct.

21. An installation according to claim 20, characterized in that the walls are disposed inside the duct.

* * * * *

UNITED STATES PATENT AND TRADEMARK OFFICE
CERTIFICATE OF CORRECTION

| | |
|---|---|
| PATENT NO. | : 7,691,440 B2 |
| APPLICATION NO. | : 10/475464 |
| DATED | : April 6, 2010 |
| INVENTOR(S) | : Bruno Bernard et al. |

It is certified that error appears in the above-identified patent and that said Letters Patent is hereby corrected as shown below:

Column 3, line 26, "her" should read --other--; and

Column 7, claim 7, line 55, "6" should read --5--.

Signed and Sealed this
Sixteenth Day of August, 2011

David J. Kappos
*Director of the United States Patent and Trademark Office*